(12) United States Patent
Kim et al.

(10) Patent No.: US 10,439,154 B2
(45) Date of Patent: Oct. 8, 2019

(54) DISPLAY DEVICE WITH ROLLABLE DISPLAY PANEL

(71) Applicant: LG Display Co., Ltd., Seoul (KR)

(72) Inventors: Jeonghun Kim, Goyang-si (KR); Bongchul Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/046,756

(22) Filed: Jul. 26, 2018

(65) Prior Publication Data

US 2019/0036049 A1    Jan. 31, 2019

(30) Foreign Application Priority Data

Jul. 31, 2017  (KR) .......................... 10-2017-0096877

(51) Int. Cl.
| | | |
|---|---|---|
| *H01L 51/00* | (2006.01) | |
| *H01L 27/32* | (2006.01) | |
| *G09G 3/3233* | (2016.01) | |
| *G09G 3/3266* | (2016.01) | |
| *G09G 3/3275* | (2016.01) | |

(52) U.S. Cl.
CPC ....... *H01L 51/0097* (2013.01); *G09G 3/3233* (2013.01); *G09G 3/3266* (2013.01); *G09G 3/3275* (2013.01); *G09G 2300/0809* (2013.01); *G09G 2310/08* (2013.01); *G09G 2380/02* (2013.01); *H01L 27/3244* (2013.01); *H01L 2251/5338* (2013.01)

(58) Field of Classification Search
CPC ............. H01L 51/5287; H01L 2251/50; H01L 2251/53
See application file for complete search history.

(56) References Cited

U.S. PATENT DOCUMENTS

| | | | |
|---|---|---|---|
| 2015/0340004 A1 | 11/2015 | Pang | |
| 2016/0132281 A1* | 5/2016 | Yamazaki | G06F 3/1446 345/1.3 |
| 2016/0143162 A1 | 5/2016 | Van Dijk et al. | |
| 2016/0202729 A1* | 7/2016 | Lee | G06F 1/1652 361/750 |
| 2016/0374228 A1 | 12/2016 | Park et al. | |
| 2017/0031387 A1 | 2/2017 | Kim | |

FOREIGN PATENT DOCUMENTS

| | | |
|---|---|---|
| JP | 2006-507543 A | 3/2006 |
| JP | 2006-279841 A | 10/2006 |
| JP | 2007-293303 A | 11/2007 |
| JP | 2008-185853 A | 8/2008 |

* cited by examiner

*Primary Examiner* — Cheung Lee
(74) *Attorney, Agent, or Firm* — Seed IP Law Group LLP

(57) ABSTRACT

The present disclosure provides a display device comprising: a rollable display panel configured to display an image; a display-panel roller, the display panel being fixed thereto; a support frame, the display-panel roller being rotatably coupled to the frame; and a first protective sheet, wherein when the panel is coiled around the panel roller, the first protective sheet is removably applied on a front face of the display panel. Thus, when the display panel is coiled around a display-panel roller, scratched may be suppressed in the panel.

12 Claims, 13 Drawing Sheets

(a)

(b)

DISPLAY DEVICE WITH ROLLABLE DISPLAY PANEL

CROSS-REFERENCE TO RELATED APPLICATIONS

This application claims the priority of Korean Patent Application No. 10-2017-0096877 filed on Jul. 31, 2017, in the Korean Intellectual Property Office, the disclosure of which is hereby incorporated by reference in its entirety.

BACKGROUND

Technical Field

The present disclosure relates to a display device with a rollable display panel.

Description of the Related Art

As the information technology has developed gradually, a market of display devices as communication means used to transmit information to users is increasing. In this connection, display devices such as an organic light emitting display (OLED), a liquid crystal display (LCD), and a plasma display panel (PDP) are increasingly employed.

The organic light emitting display (OLED) includes a display panel including a plurality of sub-pixels, and a driver for driving the display panel. The driver includes a scan driver configured to supply a scan signal or a gate signal to the display panel, and a data driver configured to supply a data signal to the display panel.

The organic light emitting display (OLED) may have flexibility. Thus, the display panel thereof may be bent or curved. Further, the display panel may be rolled in a roll shape and then extend in a flat shape. In recent years, a variety of structures have been designed to accommodate the flexible display panel of the organic light emitting diodes (OLEDs).

BRIEF SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure provides a display device with a rollable display panel in which when the display panel is coiled around a display-panel roller, scratched may be suppressed in the panel.

The present disclosure provides a display device with a rollable display panel in which when the display panel is uncoiled and is in an extended state, the panel may be protected from an external impact.

In accordance with the present disclosure, there is provided a display device comprising: a rollable display panel configured to display an image; a display-panel roller, the display panel being fixed thereto; a support frame, the display-panel roller being rotatably coupled to the frame; and a first protective sheet, wherein when the panel is coiled around the panel roller, the first protective sheet is removably applied on a front face of the display panel, wherein when the panel is uncoiled from the panel roller, the first sheet is uncoiled together with the display panel from the display-panel roller.

In one embodiment, the device further comprises a first protective-sheet roller configured to coil the first protective sheet around the first protective-sheet roller when the first sheet is uncoiled together with the display panel from the display-panel roller.

In one embodiment, the first protective-sheet roller is positioned to press a front face of the display panel when the panel is uncoiled from the panel roller.

In one embodiment, the device further comprises a rear-face pressing roller, wherein the rear-face pressing roller is positioned to press a rear face of the display panel when the panel is uncoiled from the panel roller.

In one embodiment, the first protective sheet is made of a conductive material.

In one embodiment, the device further comprises a second protective sheet, wherein when the panel is uncoiled from the panel roller into an extended state, the second protective sheet is removably applied on the front face of the display panel, wherein when the panel is coiled around the panel roller into a rolled state, the second sheet is removed with the display panel.

In one embodiment, the device further comprises a second protective-sheet roller configured to coil the second protective sheet around the second protective-sheet roller when the second sheet is removed with the display panel.

In one embodiment, the second protective-sheet roller is positioned to press a front face of the display panel when the panel is in the extended state.

In one embodiment, the device further comprises a rear-face pressing roller, wherein the rear-face pressing roller is positioned to press a rear face of the display panel when the panel is uncoiled from the panel roller.

In one embodiment, the second protective sheet has an air gap defined therein at a contact face thereof with the front face of the display panel.

In the display device accordance with the present disclosure, the first protective sheet is applied on the display panel that is wound around the display-panel roller. Thus, the first protective sheet is disposed between the front face and the rear face of the rolled display panel. As a result, the front face of the display panel may not come into contact with the rear face of the display panel, thereby suppressing the scratches, which may be otherwise generated in the panel.

Further, in accordance with the present disclosure, when the panel is uncoiled from the panel roller into the extended state, the second protective sheet is removably applied on the front face of the display panel. Thus, when the display panel is uncoiled and is in the extended state, the panel may be protected from an external impact.

DETAILED DESCRIPTIONS

Figure 1:
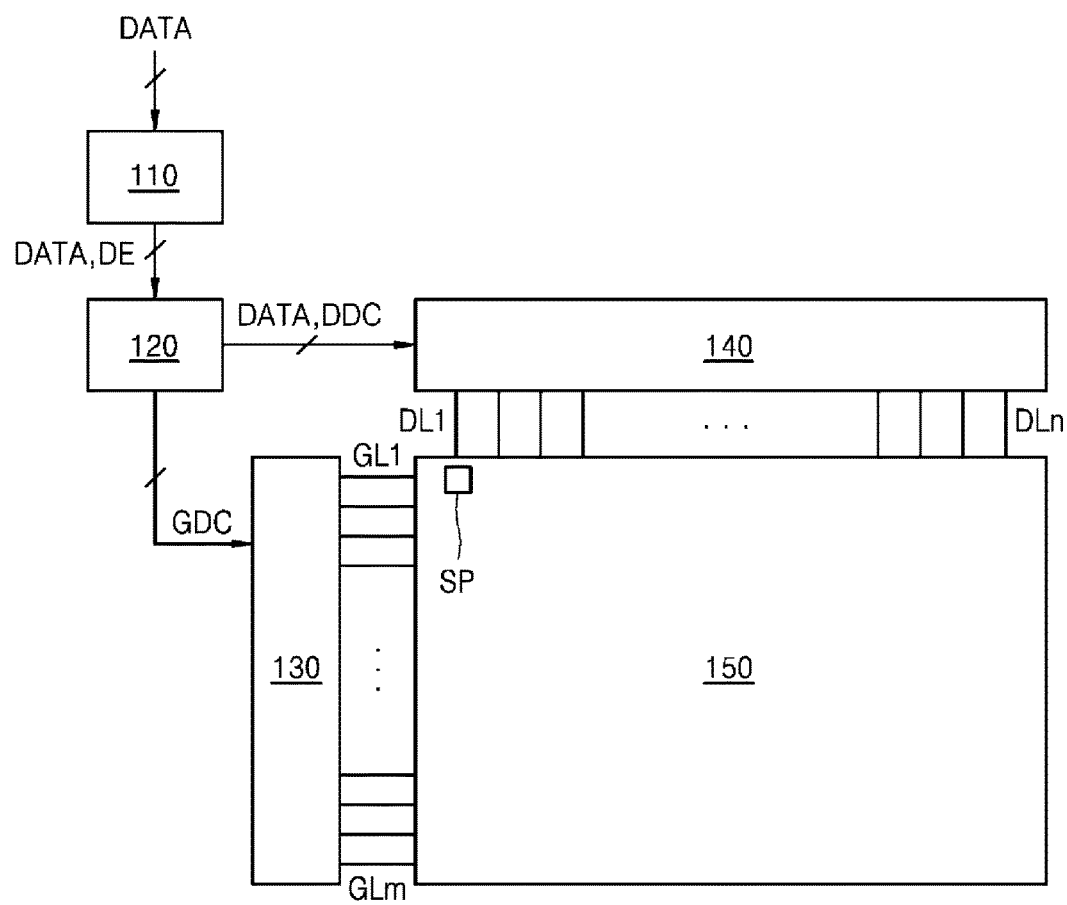
FIG. 1 is a block diagram of an organic electroluminescent display device according to an embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, a display device with a rollable display panel according to the present disclosure will be described in detail with reference to the accompanying drawings.

Hereinafter, an organic electroluminescent display device will be described as an example of implementing a display device with a rollable display panel. However, the present disclosure is not limited thereto. Any display panel capable of implementing a display device with a rollable display panel may be applied to the present disclosure.

Figure 2:
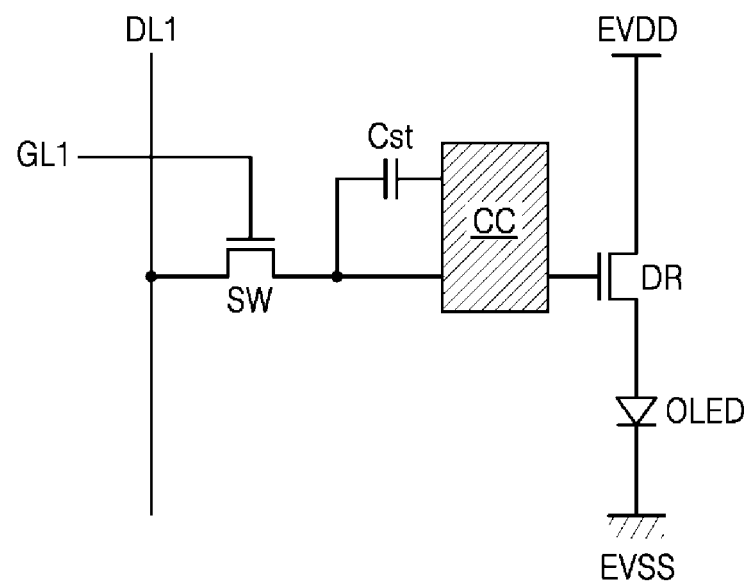
FIG. 2 shows a circuit diagram of a sub-pixel.
Figure 3:
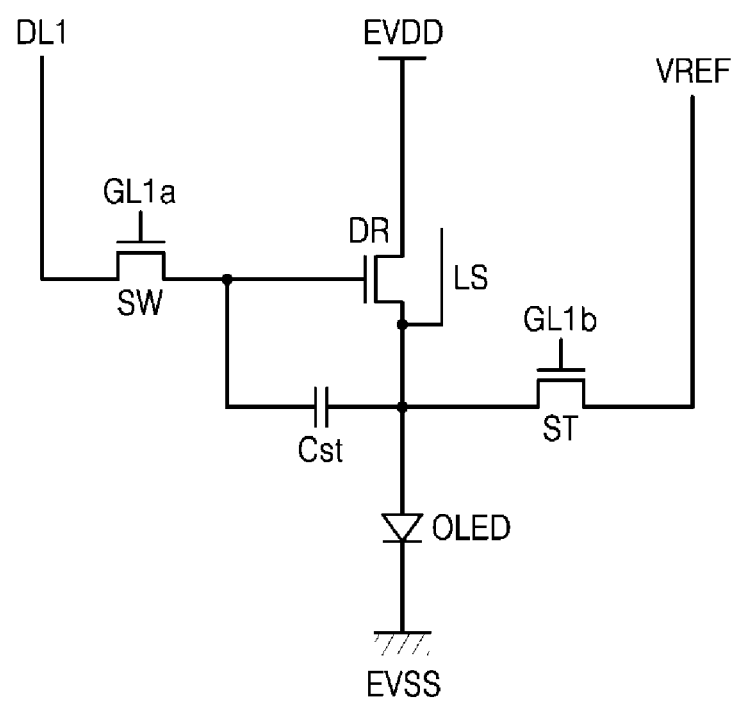
FIG. 3 shows an example of a sub-pixel configuration according to an embodiment of the present disclosure.

FIG. 1 is a schematic block diagram of an organic electroluminescent display device according to an embodiment of the present disclosure. FIG. 2 shows a schematic circuit diagram of a sub-pixel. FIG. 3 shows a structure of a sub-pixel according to an embodiment of the present disclosure.

As shown in FIG. 1, an organic electroluminescent display device according to an embodiment of the present disclosure includes an image processing unit 110, a timing control unit 120, a data driver 140, a scan driver 130, and a display panel 150.

The image processing unit 110 may be configured to output a data enable signal DE together with a data signal DATA supplied from the outside.

In addition to the data enable signal DE, the image processing unit 110 may be configured to output at least one of a vertical synchronization signal, a horizontal synchronization signal, and a clock signal. These signals have been omitted from the drawings for convenience of illustration.

The timing control unit 120 may be configured to receive the data signal DATA in addition to a drive signal including the data enable signal DE or the vertical synchronization signal, the horizontal synchronization signal, and the clock signal from the image processing unit 110. The timing control unit 120 may be configured to output a gate timing control signal GDC for controlling an operation timing of the scan driver 130 based on the drive signal and to output a data timing control signal DDC for controlling an operation timing of the data driver 140 based on the drive signal.

In response to receiving the data timing control signal DDC supplied from the timing control unit 120, the data driver 140 may be configured to sample and latch the data signal DATA supplied from the timing control unit 120, and, then, to convert the sample and latched data signal into a gamma reference voltage and to output the gamma reference voltage. The data driver 140 outputs the data signal DATA via data lines DL1 to DLn. The data driver 140 may be implemented as an IC (Integrated Circuit).

The scan driver 130 may be configured to output the scan signal while shifting the level of the gate voltage in response to the reception of the gate timing control signal GDC supplied from the timing control unit 120. The scan driver 130 outputs a scan signal through the scan lines GL1 to GLm. The scan driver 130 may be implemented as an IC integrated circuit, or may be formed in the display panel 150 in a GIP (gate in panel) manner.

The display panel 150 may be configured to display an image based on the data signal DATA and the scan signal supplied from the data driver 140 and the scan driver 130. The display panel 150 includes sub-pixels SP operable to display an image.

The sub-pixel may be implemented as a top-emission type, a bottom-emission type, or a dual-Emission type depending on a structure thereof.

The sub-pixels SP may include a red sub-pixel, a green sub-pixel, and a blue sub-pixel. Alternatively, the sub-pixels SP may include a white sub-pixel, a red sub-pixel, a green sub-pixel, and a blue sub-pixel. The sub-pixels SP may have at least one different light emission area, based on the light emission characteristics thereof.

As shown in FIG. 2, one sub-pixel includes a switching transistor SW, a driving transistor DR, a capacitor Cst, a compensation circuit CC, and an organic light emitting diode OLED.

The switching transistor SW is configured to perform a switching operation in response to the reception of the scan signal supplied through the first scan line GL1 so that the data signal supplied via the first data line DL1 is stored as a data voltage in the capacitor Cst. The drive transistor DR is configured to allow a drive current to flow into between a first power supply line EVDD and a second power supply line EVSS in accordance with the data voltage stored in the capacitor Cst. The organic light emitting diode OLED operates to emit light using the drive current from the drive transistor DR.

The compensation circuit CC may be a circuit added within the sub-pixel to compensate a threshold voltage of the drive transistor DR. The compensation circuit CC may include at least one transistor. A configuration of the compensation circuit CC varies greatly depending on a compensation method thereof. An example thereof is as follows.

As shown in FIG. 3, the compensation circuit CC includes a sensing transistor ST and a sensing line VREF. The sensing transistor ST is connected to a node (hereinafter referred to as a sensing node) between a source line of the drive transistor DR and an anode of the organic light emitting diode OLED. The sensing transistor ST is configured to supply an initialization voltage (or a sensing voltage) transmitted through the sensing line VREF to the sensing node or to sense a voltage or current of the sensing node.

The switching transistor SW includes a first electrode connected to the first data line DL1 and a second electrode connected to the gate electrode of the drive transistor DR. The drive transistor DR has a first electrode connected to the first power line EVDD and a second electrode connected to the anode of the organic light emitting diode OLED. The capacitor Cst has a first electrode connected to the gate electrode of the drive transistor DR and a second electrode connected to the anode of the organic light emitting diode OLED. The organic light emitting diode OLED has an anode connected to the second electrode of the drive transistor DR and a cathode connected to the second power line EVSS. The sensing transistor ST has a first electrode connected to the sensing line VREF and a second electrode connected to the anode of the organic light emitting diode OLED.

As used herein, the first electrode and the second electrode are defined as a source electrode and a drain electrode, or a drain electrode and a source electrode, respectively, based on the type of the transistor.

An operating time of the sensing transistor ST may be similar to or different from the operating time of the switching transistor SW, depending on the configuration or the compensation algorithm of the compensation circuit. In one example, the switching transistor SW has a gate electrode connected to a first sub-scan line GL1a, while the sensing transistor ST has a gate electrode connected to a second sub-scan line GL1b. In another example, the first sub-scan line GL1a coupled to the gate electrode of the switching transistor SW and the first sub-scan line GL1b coupled to the gate electrode of the sensing transistor ST may be shared by both transistors SW and ST.

The sensing line VREF may be connected to the data driver. In this case, the data driver may sense the sensing node of the sub-pixel during a non-display period of the image or an N frame (N is an integer of 1 or more) period, or in real time, and then, may allow the compensation circuit to perform the compensation based on the sensing result. In one example, the switching transistor SW and the sensing transistor ST may be turned on at the same time. In this case, the sensing operation through the sensing line VREF and the data output operation for outputting the data signal are distinguished from each other based on a time division by the data driver.

In addition, data to be compensated based on the sensing result may include a digital based data signal, an analog based data signal or a gamma voltage, and the like. Further, the compensation circuit for generating the compensation signal or the compensation voltage based on the sensing result may be implemented inside the data driver, inside the timing control unit, or as a separate circuit.

In FIG. 3, a sub-pixel having a 3T (transistors) 1C (capacitor) structure including the switching transistor SW, drive transistor DR, capacitor Cst, organic light emitting diode OLED, and sensing transistor ST is illustrated as an example. However, the present disclosure is not limited thereto. When the compensation circuit CC is added in the sub-pixel, the sub-pixel may include 3T2C, 4T2C, 5T1C, or 6T2C structure, or the like.

Because the organic electroluminescent display device as described above does not require a backlight unit, the organic electroluminescent display device may have a thinner display panel than that of a liquid crystal display. Further, since the display panel of the organic electroluminescent display device may be flexible as thin as possible, the display panel may be bent or curved. Further, the panel may be deformed in a rolled shape or the like.

Therefore, in recent years, various types of mechanical structures for housing display panels of the organic electroluminescent display devices have been designed. Hereinafter, a structure of a display panel that is rollable or extendable to implement a display device with a rollable display panel will be described.

Figure 4:
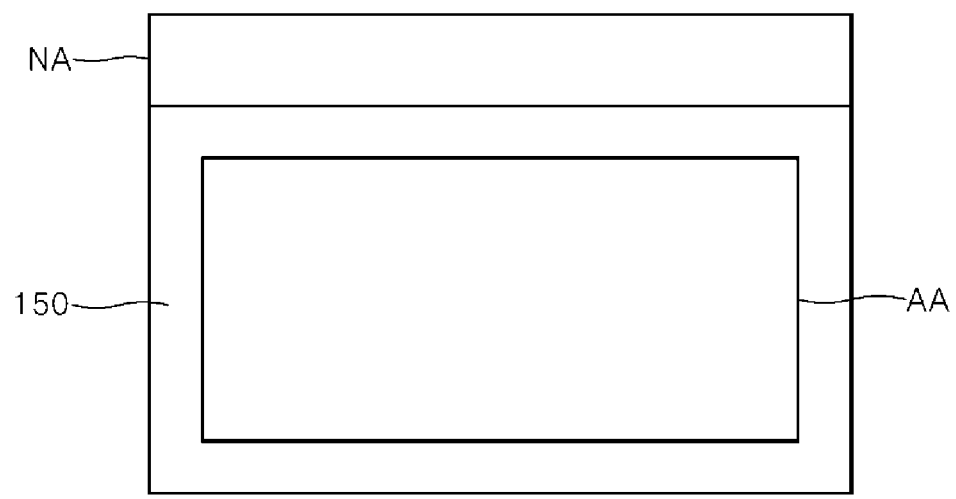
FIG. 4 is a plan view of a display panel according to an embodiment of the present disclosure.
Figure 5:
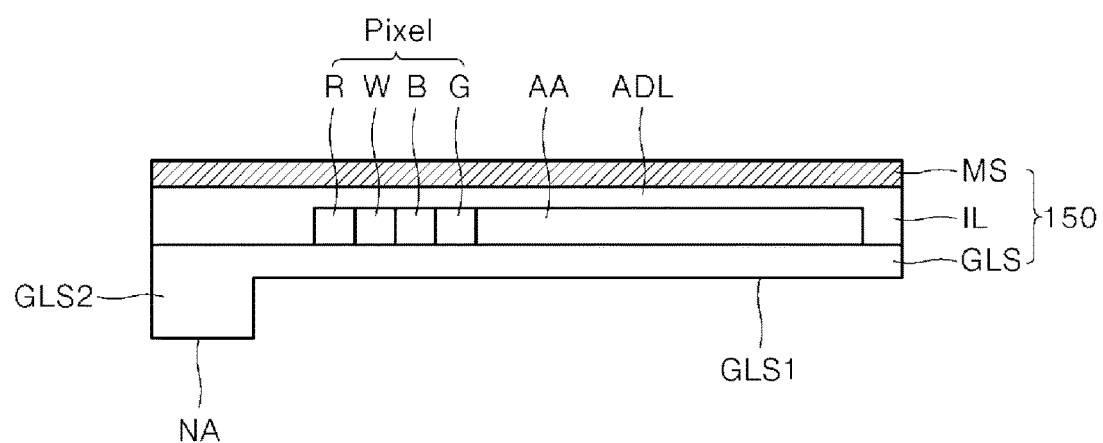
FIG. 5 is a cross-sectional view of a display panel according to an embodiment of the present disclosure.
Figure 6:
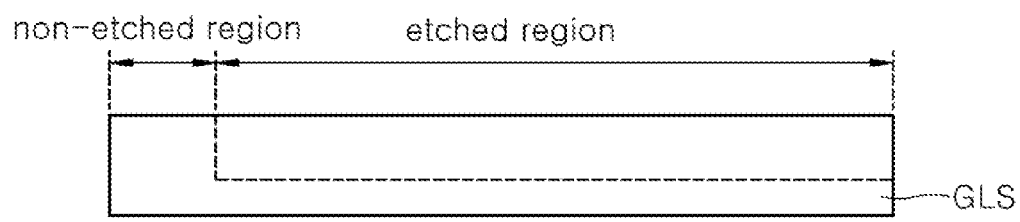
FIG. 6 is a sectional view showing an example of etching of a first substrate.
Figure 6:
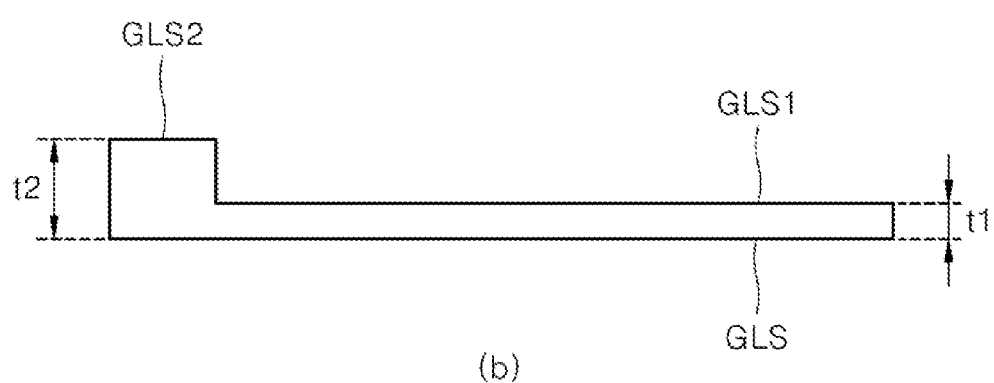
Figure 7:
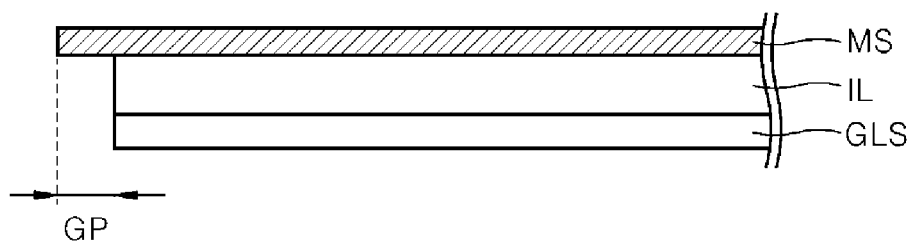
FIG. 7 is a sectional view showing an example of bonding between first substrate and second substrate.
Figure 8:
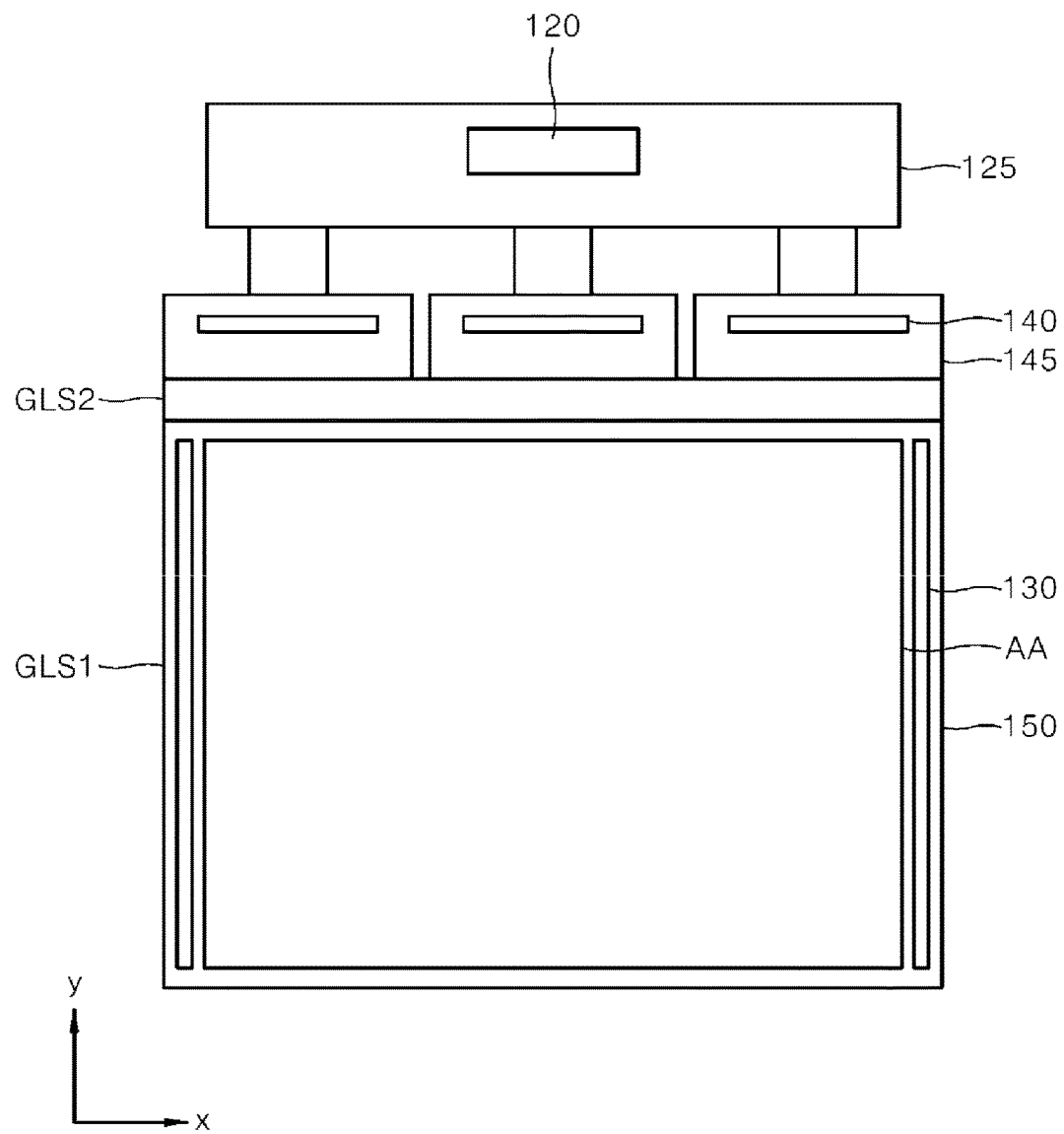
FIG. 8 is a plan view showing a modularized display panel.

FIG. 4 is a top view of an exemplary display panel according to an embodiment of the present disclosure. FIG. 5 is a cross-sectional view of an exemplary display panel according to an embodiment of the present disclosure. FIG. 6 is a cross-sectional view showing an example etching of a first substrate. FIG. 7 is a cross-sectional view of a first substrate and second substrate as bonded together. FIG. 8 is a plan view of a modular display panel.

As shown in FIGS. 4 to 8, a display panel 150 according to an embodiment of the present disclosure includes a first substrate GLS, an intermediate layer IL having a display region AA including a plurality of pixels, and a second substrate MS.

The intermediate layer IL has an adhesive layer ADL in addition to the plurality of pixels constituting the display region AA. The plurality of pixels may include sub-pixels configured for emitting red R, white W, blue B and green G light beams. However, the present disclosure is not limited thereto. The adhesive layer ADL may be made of an adhesive material which enables bonding between first substrate GLS and second substrate MS, and seals the intermediate layer IL located between the first substrate GLS and the second substrate MS.

The first substrate GLS may be made of glass or resin. A thickness of the first substrate GLS may be 0.01 mm to 0.2 mm.

From experimental results, it may be confirmed that when the thickness of the first substrate GLS is as thin as 0.01 mm to 0.1 mm, and even when the first substrate is made of glass instead of resin, the first substrate may be rolled into a rolled state or may be unrolled in an extended state.

The first substrate GLS has an etched region (etched portion) GLS1 and a non-etched region (non-etched portion) GLS2. On the non-etched region GLS2, a pad for connection with an external substrate may be disposed. The non-etched region GLS2 has an elongated rectangular shape.

In the non-etched region GLS2, the first substrate may be connected to an external substrate. The non-etched portion enhances the rigidity of the substrate. To this end, it is desirable that the non-etched region GLS2 occupies 5% to 10% of a total area of the first substrate GLS. Further, the non-etched region GLS2 has a higher rigidity than that of the etched region GLS1. To this end, the thickness t2 of the non-etched region GLS2 is preferably selected to be in a range of from 0.1 mm to 0.2 mm.

Except for the non-etched region GLS2, the first substrate is partially removed by an etching process to form the etched region GLS1. The etched region GLS1 is provided to mitigate a tensile stress that the first substrate GLS may receive when the display panel 150 is rolled in a rolled state or is unrolled in an extended state. For this purpose, a thickness t1 of the substrate in the etched region GLS1 is preferably selected from the range of 0.01 mm to 0.1 mm.

The second substrate MS may be made of metal. A thickness of the second substrate MS may be selected from a range of 0.01 mm to 0.2 mm. The second substrate MS absorbs, disperses and alleviates the tensile stress that the first substrate GLS may receive when the display panel 150 is coiled in a rolled state or is unrolled in an extended state.

From experimental results, it may be confirmed that when the thickness of the second substrate MS is as thin as 0.01 mm to 0.2 mm, the second substrate effectively absorbs, disperses and alleviates the tensile stress that the first substrate GLS may receive when the display panel 150 is coiled in a rolled state or is unrolled in an extended state.

Since the second substrate MS is made of a metal material, the second substrate is more resistant to impact than the first substrate GLS. As a result, the second substrate MS may be made larger than the first substrate GLS. That is, the second substrate MS may have a protruding region GP in which the second substrate protrudes outward, as compared to the first substrate GLS. The protruding region may exist at one or more positions. Further, the protrusion region GP of the second substrate MS may effectively serve to protect a corner of the first substrate from an impact that the first substrate GLS may otherwise receive.

Meanwhile, the display panel 150 may be electrically connected to the timing control unit 120, data driver 140, scan driver 130, and the like (the image processing unit or power supply unit is not shown). As a result, the display panel is modularized as shown in FIG. 8.

The scan driver 130 is formed in the display panel 150 in a gate-in-panel fashion. The data driver 140 is implemented in the source substrate 145. The timing control unit 120 and the like are mounted in the control substrate 125.

In order to coil the display panel 150 in a rolled state, it may be preferable to form the scan driver 130 to the left side and/or the right side of the display region AA in a GIP (Gate In Panel) manner. However, the present disclosure is not limited thereto. Further, the data driver 140 may be mounted in the source substrate 145 serving as a flexible circuit board, while the timing control unit 120 and the like may be mounted in the control substrate 125 serving as the printed circuit board. However, the present disclosure is not limited thereto. Further, the source substrate 145 and the control substrate 125 may be connected with each other via a cable. However, the present disclosure is not limited thereto.

Hereinafter, a mechanical structure for implementing a display device with a rollable display panel will be described.

Figure 9:
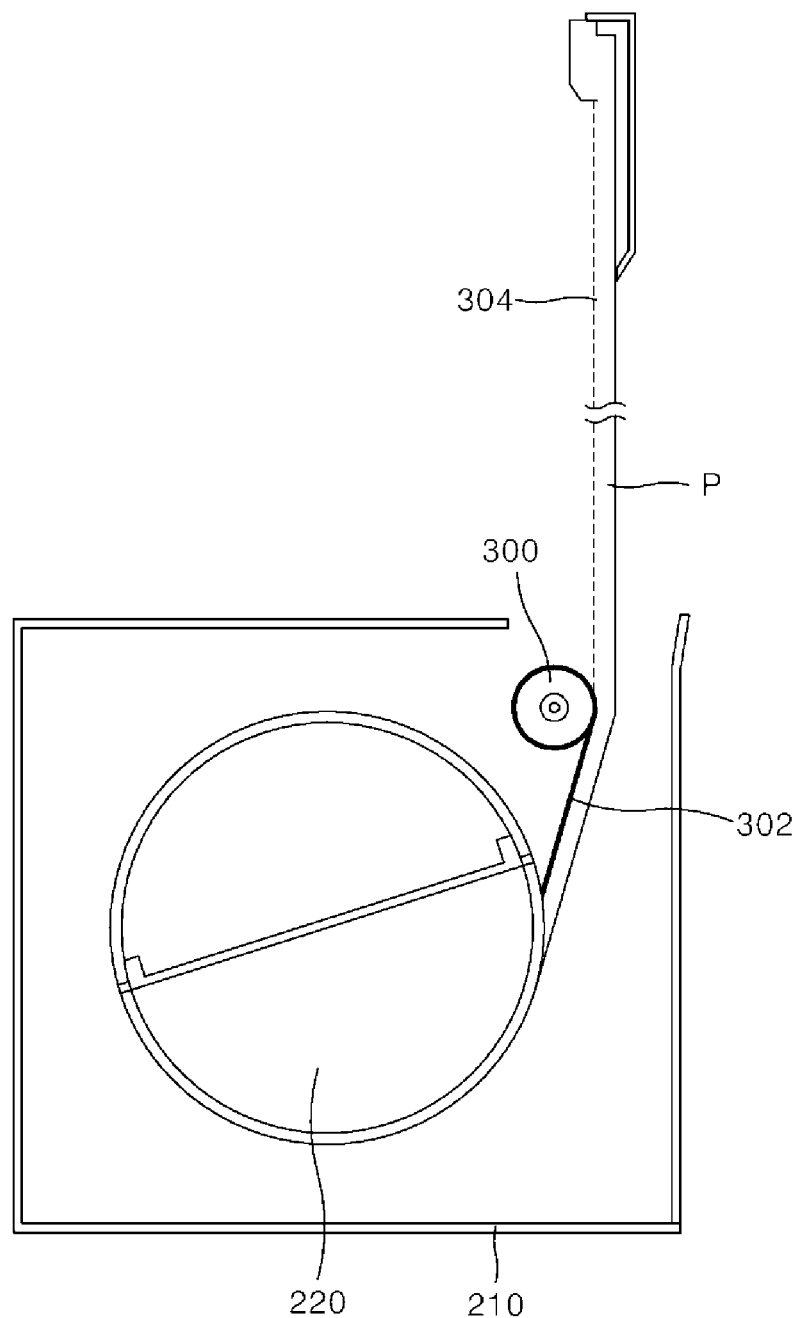
FIGS. 9 and 10 show a display device with a rollable display panel according to an embodiment of the present disclosure.
Figure 10:
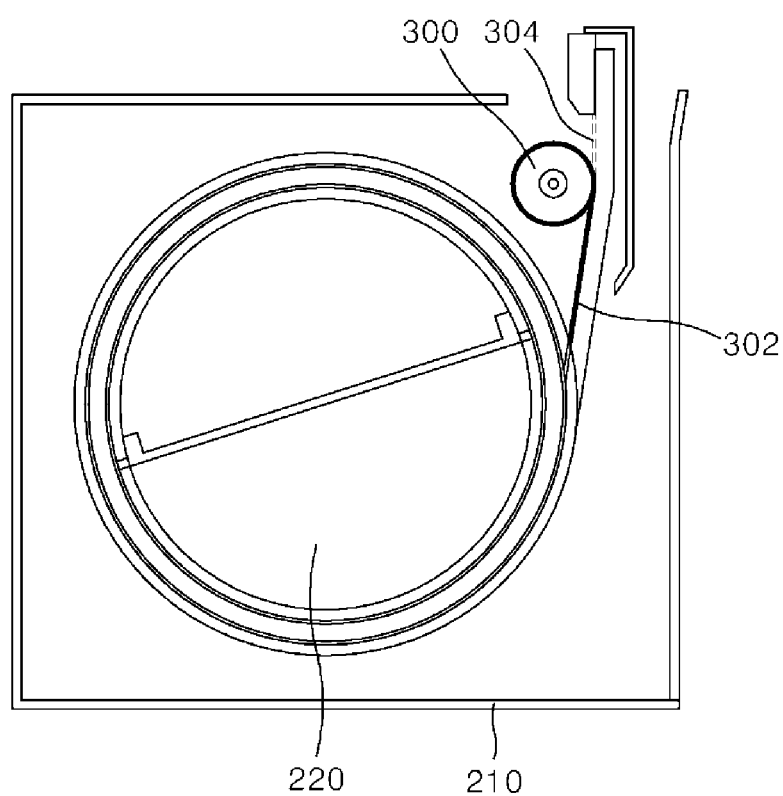

FIG. 9 and FIG. 10 show a display device with a rollable display panel according to an embodiment of the present disclosure.

As shown, the display device with a rollable display panel according to an embodiment of the present disclosure includes a display panel P for displaying an image, and a rolling and unrolling mechanism for rolling or unrolling the display panel P.

The rolling and unrolling mechanism includes a display-panel roller 220 to which the display panel P is fixed, a support frame 210 to which the display-panel roller is rotatably coupled, and a first protective sheet 302 removably applied on a front face of the display panel P, wherein the sheet is unrolled together with the display panel P from the display-panel roller 220.

When the display panel P is rolled around the display-panel roller 220, the front face (display face) and a rear face of the display panel P are brought into contact with each other. At this time, scratches may be generated in the front face of the display panel P by a stiffener existing in the rear face of the display panel P.

According to the present disclosure, the scratches in the front face of the display panel P from which the image is displayed, which result from repetition of winding and unwinding of the rollable display panel P may be reduced.

To this end, the display device according to the present disclosure includes the first protective sheet 302 removably applied on the front face of the rollable display panel.

The first protective sheet 302 may be interposed between the front and rear faces of the display panel P as rolled around the display-panel roller 220.

This first protective sheet 302 may be wound around a first protective-sheet roller 300 disposed adjacent to the display-panel roller 220. The first protective sheet is unwound from the display-panel roller 220 and then is rolled around the first protective-sheet roller 300. As a result, when the display panel is unrolled into an extended state, the first protective sheet 302 is not exposed to the outside.

The first protective sheet 302 may be made of a conductive material. When the first protective sheet 302 is made of the conductive material, the first protective sheet 302 acts as a grounding channel for the display panel P. As a result, the static electricity and noise generated in the display panel P may be reduced.

As shown in FIG. 9, the display panel P extends or is unrolled outwardly from the panel roller in the support frame 210. At this time, the first protective sheet 302 is wound around the first protective-sheet roller 300. Then, as shown in FIG. 10, when the display panel P is wound around the display-panel roller 220, the first protective sheet 302 is unrolled from the first protective-sheet roller 300 and then applied to the display panel, and, then, is rolled around the display-panel roller 220 together with the panel P.

Further, the first protective-sheet roller 300 may be positioned to press the front face of the display panel P as is unrolled in the extended state. Thus, the roller 300 may press a bottom portion of the display panel P as drawn out from the support frame 210. As a result, the drawn-out display panel P may be kept flat.

The first protective-sheet roller 300 rolls the first protective sheet around the roller 300 by using an elastic force of an elastic member (not shown). In other words, as shown in FIG. 10, when the first protective sheet 302 is released from the first protective-sheet roller 300, the elastic force is stored in the first protective-sheet roller 300. When the display panel P is pulled out from the support frame 210, the stored elastic force enables the first protective-sheet roller 300 to rotate. In this way, the first protective sheet 302 is automatically wound around the first protective-sheet roller 300.

Further, the display device according to the present disclosure may further include a second protective sheet 304 applied to a front face of the rollable display panel P.

The second protective sheet 304 prevents the front face of the display panel P from being damaged by an impact or the like.

The second protective sheet 304 may be always coated on the entire front face of the display panel P. Alternatively, the second protective sheet 304 may be removably applied on the front face of the rollable display panel P. That is, the display panel P may be applied on the front face of the extended panel P when the display panel P is pulled out from the support frame 210, which is in contrast to the first protective sheet 302.

The second protective sheet 304 may be made of a transparent synthetic resin material. In one embodiment, the second protective sheet 304 may serve as a polarizing film as an optical member for the display panel. In this case, the second protective sheet 304 may be made of a material having polarization property.

Although not shown in the drawing, the present device may include a separate driving means for driving the display-panel roller 220.

Figure 11:
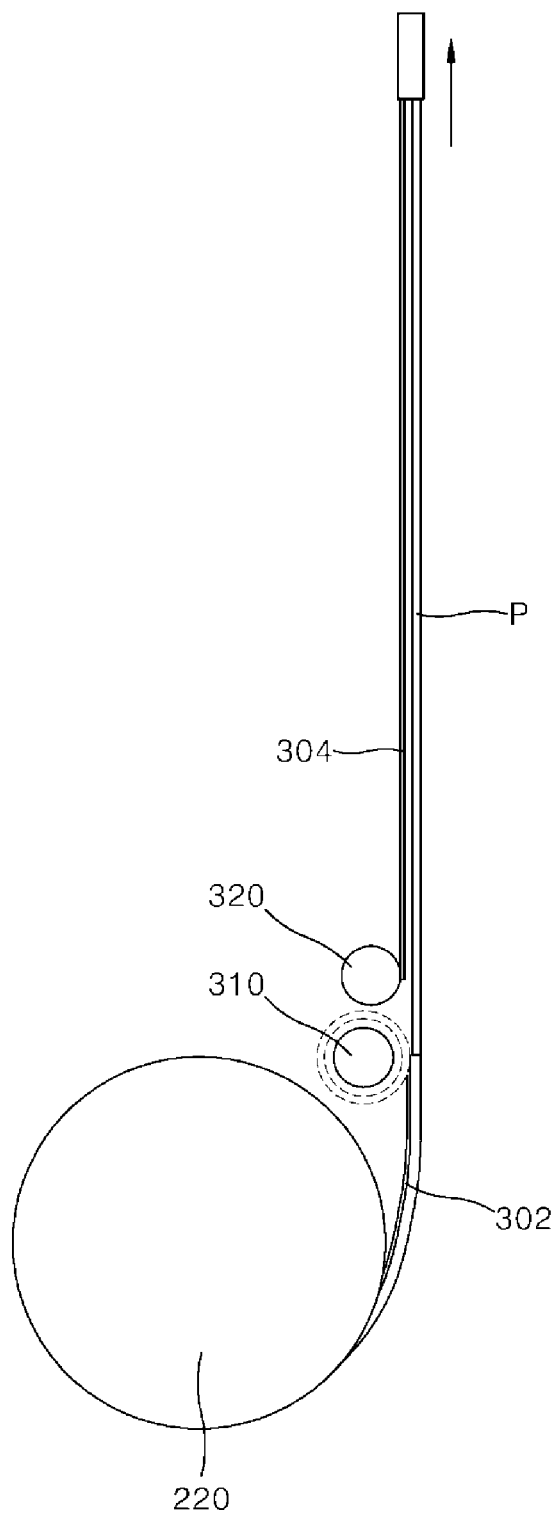
FIGS. 11 and 12 show a display device with a rollable display panel according to another embodiment of the present disclosure.
Figure 12:
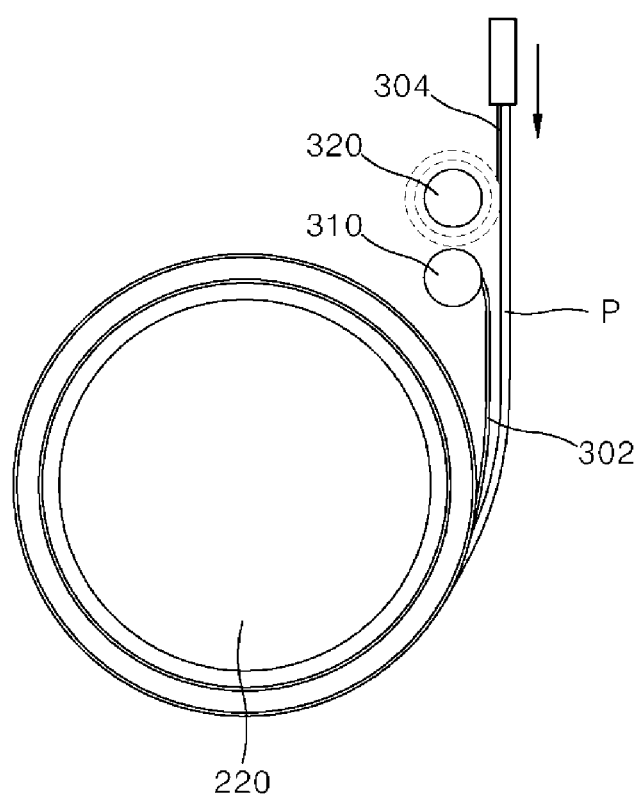

FIG. 11 and FIG. 12 show a display device with a rollable display panel according to another embodiment of the present disclosure.

A display device with a rollable display panel according to this embodiment includes a first protective sheet roller 310 configured for winding a first protective sheet 302 around the roller 310, and a second protective sheet roller 320 configured for winding a second protective sheet 304 around the roller 320.

When the display panel P is drawn out from the support frame, the first protective-sheet roller 310 winds the first protective sheet 302 as detachably applied on the panel P around the roller 310.

When the display panel P changes from the extended state to a rolled state into the support frame, the second protective-sheet roller 320 winds the second protective sheet 304 as detachably applied on the panel P around the roller 320. The second protective sheet 304 is wound around the second protective sheet roller 320 so that the second protective sheet 304 does not rub against the back surface of the display panel P when the panel P is coiled around the roller 220. The second protective sheet 304 is applied to the front face of the display panel P in an extended state so that scratches do not occur in the display panel P.

The second protective-sheet roller 320 rolls the second protective sheet around the roller 320 by using an elastic force of an elastic member (not shown). In other words, as shown in FIG. 11, when the second protective sheet 302 is released from the second protective-sheet roller 320, the elastic force is stored in the second protective-sheet roller 320. When the display panel P is coiled into the support frame 210 as shown in FIG. 12, the stored elastic force enables the second protective-sheet roller 320 to rotate. In this way, the second protective sheet 302 may be automatically wound around the second protective-sheet roller 320.

As shown, the first protective-sheet roller 310 is disposed adjacent to the display-panel roller 220. The second protective-sheet roller 320 is disposed adjacent to the first protective-sheet roller 310. The first protective-sheet roller 310 is disposed between the display-panel roller 220 and the second protective-sheet roller 320.

The first protective sheet roller 310 applies the first protective sheet on the display panel when the panel is wrapped around the display-panel roller 220. The second protective-sheet roller 320 applies the second protective sheet on the display panel P when the panel is drawn from the support frame.

As shown, in the embodiment in which both the first protective-sheet roller 310 and the second protective-sheet roller 320 are provided, it is desirable for the second protective-sheet roller 320 to press the front face of the display panel P in the extended state. This is because the second protective-sheet roller 320 is disposed closer to the display panel P in the expanded state than the first protective-sheet roller 310.

Further, it is preferable that an air gap be formed between the second protective sheet 304 and the face of the display panel P. This prevents the second protective sheet 304 from rubbing directly the display panel P. This prevents the friction between the display panel P and the second protective sheet 304 and suppresses damage of the panel P.

Further, the air gap formed between the second protective sheet 304 and the display panel P acts as a buffer zone to mitigate the impact when an external impact is applied to the second protective sheet 304. This also has the effect of reducing the transmission of the impact to the display panel P.

Figure 13:
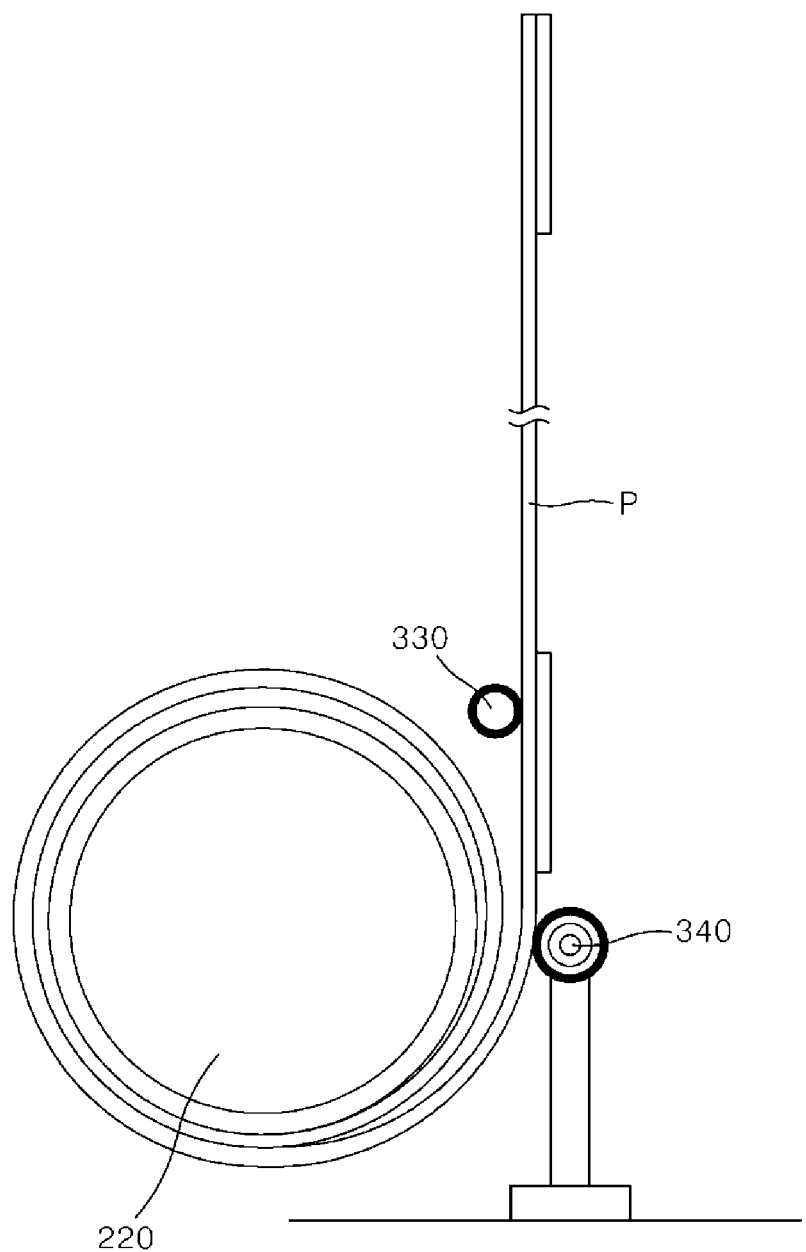
FIG. 13 shows a display device with a rollable display panel according to still another embodiment of the present disclosure.

FIG. 13 shows a display device with a rollable display panel according to still another embodiment of the present disclosure.

As shown, the display device with a rollable display panel according to this embodiment of the present disclosure includes a front front-face pressing roller 330 that presses the front face of the display panel P, and a rear-face pressing roller 340 that presses the rear face of the display panel P.

The front and rear faces of a just drawn-out portion of the display panel P may be pressed by the front face pressing roller 330 and the rear-face pressing roller 340, respectively. As a result, the flatness of the display panel P as drawn out may be ensured. Further, it is possible to reduce loosening of the wound display panel P at the time of winding the panel.

The front front-face pressing roller 330 may act as a first protective-sheet roller as described above. The rear-face pressing roller 340 may simply be a roller that presses the rear-face of the display panel P.

In another embodiment, the front front-face pressing roller 330 may serve as the second protective-sheet roller as described above. The second protective sheet is wound around the front front-face pressing roller 330. When the display panel P is drawn out from the frame, the second protective sheet is separated from the front front-face pressing roller 330 and is applied on the front face of the panel.

Further, the rear-face pressing roller 340 may serve as the first protective-sheet roller described above. When the display panel P is wound around the roller 220, the first protective sheet is separated from the rear-face pressing roller 340 and applied on the rear face of the panel.

Although not shown, two front face pressing rollers and one rear-face pressing roller may be provided. In this case, one of the two front face rollers serves as the first protective-sheet roller while the other roller serves as the second protective-sheet roller.

As described above, in the display device accordance with the present disclosure, the first protective sheet is applied on the display panel that is wound around the display-panel roller. Thus, the first protective sheet is disposed between the front face and the rear face of the rolled display panel. As a result, the front face of the display panel may not come into contact with the rear face of the display panel, thereby suppressing the scratches, which may be otherwise generated in the panel.

Further, in the display device with the rollable display panel according to the present disclosure, the second protective sheet is applied to the front face of the display panel in the extended state. This has the effect of preventing the front face of the display panel in the extended state from being damaged.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
   a rollable display panel configured to display an image;
   a display-panel roller, the display panel being fixed thereto;
   a support frame, the display-panel roller being rotatably coupled to the support frame;
   a first protective sheet structured to attach to a front face of the display panel when the display panel is coiled around the panel roller and structured to detach from the front face of the display panel when the display panel is uncoiled from the panel roller;
   a first protective-sheet roller configured to coil the first protective sheet around the first protective-sheet roller when the first sheet is uncoiled together with the display panel from the display-panel roller, wherein the first protective-sheet roller is positioned to press the front face of the display panel when the display panel is uncoiled from the panel roller; and
   a rear-face pressing roller, wherein the rear-face pressing roller is positioned to press a rear face of the display panel when the display panel is uncoiled from the panel roller.

2. The device of claim 1, wherein the first protective sheet is made of a conductive material.

3. The device of claim 1, wherein the first protective sheet is structured to be coiled together with the display panel around the panel roller and be uncoiled together with the display panel from the panel roller.

4. The device of claim 1, wherein the first protective-sheet roller rolls the first protective sheet around the first protective-sheet roller by using an elastic force of an elastic member.

5. A display device comprising:
   a rollable display panel configured to display an image;
   a display-panel roller, the display panel being fixed thereto;
   a support frame, the display-panel roller being ratatably coupled to the support frame;
   a first protective sheet structured to attach to a front face of the display panel when the display panel is coiled around the panel roller and structured to detach from the front face of the display panel when the display panel is uncoiled from the panel roller; and
   a second protective sheet structured to attach onto the front face of the display panel when the display panel is uncoiled from the panel roller into an extended state, and structured to detach from the front face of the display panel when the display panel is coiled around the panel roller into a rolled state.

6. The device of claim 5, further comprising a second protective-sheet roller configured to coil the second protective sheet around the second protective-sheet roller when the second protective sheet detaches from the display panel.

7. The device of claim 6, wherein the second protective-sheet roller is positioned to press the front face of the display panel when the display panel is in the extended state.

8. The device of claim 7, further comprising a rear-face pressing roller, wherein the rear-face pressing roller is positioned to press a rear face of the display panel when the display panel is uncoiled from the panel roller.

9. The device of claim 6, wherein the second protective-sheet roller rolls the second protective sheet around the second protective-sheet roller by using an elastic force of an elastic member.

10. The device of claim 5, wherein the second protective sheet includes an air gap at a contact face thereof with respect to the front face of the display panel.

11. The device of claim 5, wherein the second protective sheet is made of a material having polarization property.

12. The device of claim 5, wherein an air gap is formed between the second protective sheet and the front face of the display panel.

* * * * *